United States Patent [19]

Li et al.

[11] Patent Number: 5,030,844
[45] Date of Patent: Jul. 9, 1991

[54] DC POWER SWITCH WITH INRUSH PREVENTION

[75] Inventors: Edward Li, Roselle; John E. Herrmann, Mundelein, both of Ill.

[73] Assignee: Motorola, Inc., Schaumburg, Ill.

[21] Appl. No.: 542,622

[22] Filed: Jun. 25, 1990

[51] Int. Cl.[5] .............................................. H01H 9/30
[52] U.S. Cl. ..................................... 307/135; 307/115; 323/908; 361/58
[58] Field of Search ................ 307/115, 135; 323/350, 323/901, 908; 361/58

[56] References Cited

U.S. PATENT DOCUMENTS

| | | | |
|---|---|---|---|
| 3,193,750 | 7/1965 | Chait | 363/36 |
| 3,549,851 | 12/1970 | Hockenberry et al. | 320/1 |
| 3,781,637 | 12/1973 | Potter | 363/27 |
| 3,935,511 | 1/1976 | Boulanger et al. | 361/58 |
| 4,008,416 | 2/1977 | Nakasone | 323/321 |
| 4,092,709 | 5/1978 | Voigt et al. | 363/18 |
| 4,271,460 | 6/1981 | Baker | 323/908 |
| 4,328,459 | 5/1982 | McLeod | 323/321 |
| 4,405,975 | 9/1983 | Overstreet et al. | 320/1 |
| 4,555,741 | 11/1985 | Masaki | 361/58 |
| 4,628,431 | 12/1986 | Kayser | 323/908 |
| 4,636,713 | 1/1987 | Stefani | 3/350 |
| 4,680,536 | 7/1987 | Roszel et al. | 323/321 |

Primary Examiner—Steven L. Stephan
Assistant Examiner—Jeffrey Sterrett
Attorney, Agent, or Firm—Phillip H. Melamed

[57] ABSTRACT

A DC power switch (10) for a capacitive load (11) has a main transistor (Q1) in series with the load between positive and negative DC bus terminals (B+, B−). A secondary transistor (Q2) and a resistor (R1) are connected in series and this series connection is connected in parallel to the main transistor (Q1). A control circuit (20; 50) is connected to the main and secondary transistors (Q1, Q2) and controls them. In response to an enable signal (26), the secondary transistor (Q2) is initially turned on such that it and the resistor provide the initial charging current for the capacitor load (11) and subsequently the secondary transistor is turned off and the main transistor is turned on such that it provides the subsequent current required by the load. This configuration minimizes the power dissipation ratings required for the transistors while balancing this requirement with the relative rapid providing of charging current for the capacitive load. Fault detection circuitry (30-33) makes sure both the main and secondary transistors are off and interrupts the supply of DC power to the load (11) in the event of a detected fault.

18 Claims, 2 Drawing Sheets

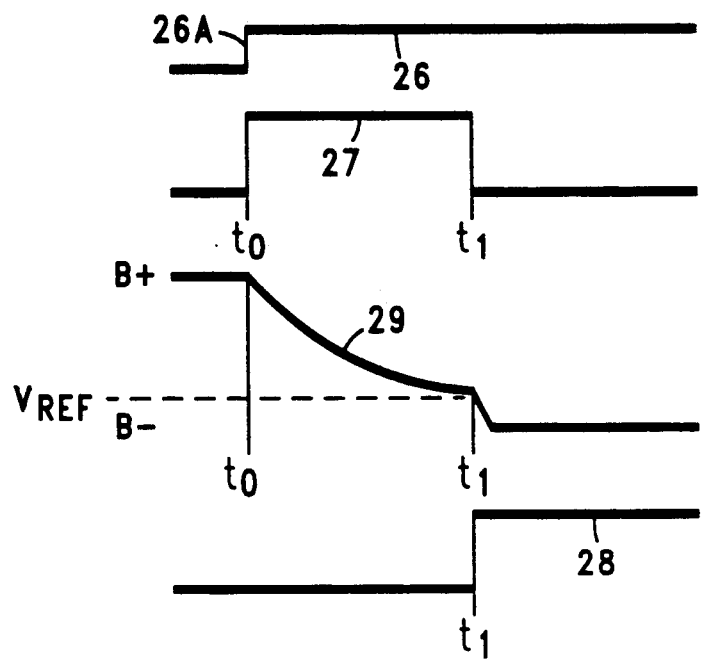
FIG.2A
FIG.2B
FIG.2C
FIG.2D
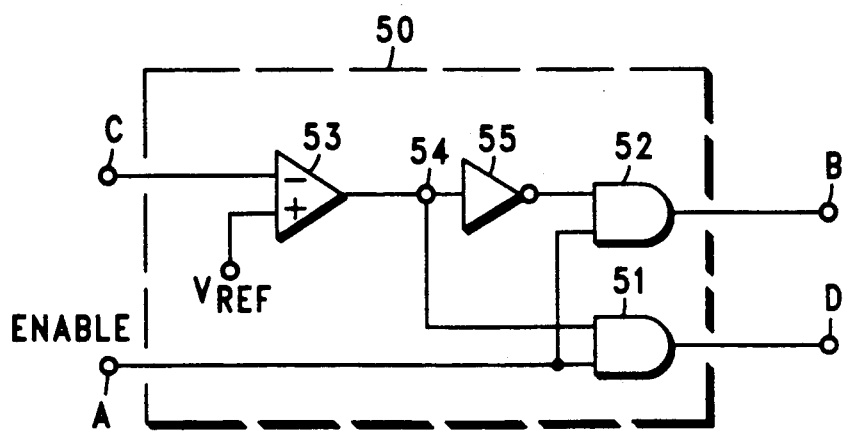
FIG.3

DC POWER SWITCH WITH INRUSH PREVENTION

FIELD OF THE INVENTION

The present invention relates to the field of DC power switches useable for selectively providing DC power to a capacitive load. More particularly, the present invention relates to such DC power switches which are implemented by semiconductor switching devices and which may therefore function as solid state DC circuit breakers.

BACKGROUND OF THE INVENTION

Often it is desirable to provide a circuit breaker switch in series with a capacitive load so as to selectively interrupt the supplying of DC power to the load. If substantial DC voltages and currents are contemplated, the circuit breaker may have to be capable of substantial power dissipation, particularly during the initial charging up of the capacitance of the load. In prior circuits, an electromechanical relay has been used when power dissipation was a concern. However, such relays have inherent long term reliability problems, are relatively expensive and may be relatively costly and bulky in size if they are required to have a substantial power dissipation/current conduction rating.

A single semiconductor switching device could be utilized in place of the above noted mechanical relay. However, the cost of such a single semiconductor component, which would be able withstand the power dissipation encountered during the initial charging time and conduct sufficient maximum current, would make the use of such a single semiconductor switch undesirable. A semiconductor switch having a lower power rating could be utilized if the semiconductor switch were only gradually or slowly turned on or if the initial charging current through the semiconductor switch was limited by feedback so that only a certain maximum power dissipation would occur in the semiconductor device during the initial charging time. However, these solutions would inherently slow down the charging up the of the capacitive load because the effective switch current multiplied by the voltage across the semiconductor switch would be limited to a maximum power dissipation rating which preferably is selected to be just enough to allow the switch to supply anticipated steady state load current. Also, any feedback current limit solution would be difficult to implement. The implementing difficulties occur because very small currents during the initial charging time could result in a very large power dissipation for the semiconductor switch due to the large voltage differential across the switch, whereas during the later stages of the charging time there is less voltage across the semiconductor switch and therefore a larger current could exist for the same power dissipation rating. Thus any type of feedback system which would limit the power dissipation of the series semiconductor switch to some preset level would have to operate over a very wide range of charging currents, and accurately implementing such switch control would be difficult.

Some prior art circuits have provided a constant resistive charging path in parallel with a semiconductor device in a power supply that provides power to a capacitive load. However, this semiconductor device, and its associated circuitry, have been inserted just to provide a small series voltage drop under some conditions while the resistor limits the DC power supply current under other conditions. Thus these circuits do not implement a circuit breaker function, responsive to fault conditions, which is connected in series between DC power and a capacitive load. This is because the resistor always provides a current bypass to the semiconductor switch. Therefore, this technique does not suggest how to prevent overpower dissipation from occurring in a series circuit breaker type switch while still achieving a relatively rapid charging up of a capacitive type load and/or implementing this without any requirement for costly high power components or extremely complex and close tolerance power dissipation feedback control circuitry.

OBJECTS OF THE INVENTION

An object of the prevent invention is to provide an improved DC power switch useable for selectively supplying DC power to a capacitive load wherein this switch overcomes the aforementioned deficiencies of prior selective DC power switches.

BRIEF DESCRIPTION OF THE DRAWINGS

For a more complete understanding of the present invention reference should be made to the drawings in which:

FIGS. 2A through 2D comprise a series of graphs illustrating waveforms for various signals provided by the circuit in FIG. 1; and FIG. 3 is an electrical schematic of an alternatively embodiment for one the circuit components shown in FIG. 1.

DETAILED DESCRIPTION OF THE PREFERRED EMBODIMENTS

Figure 1:
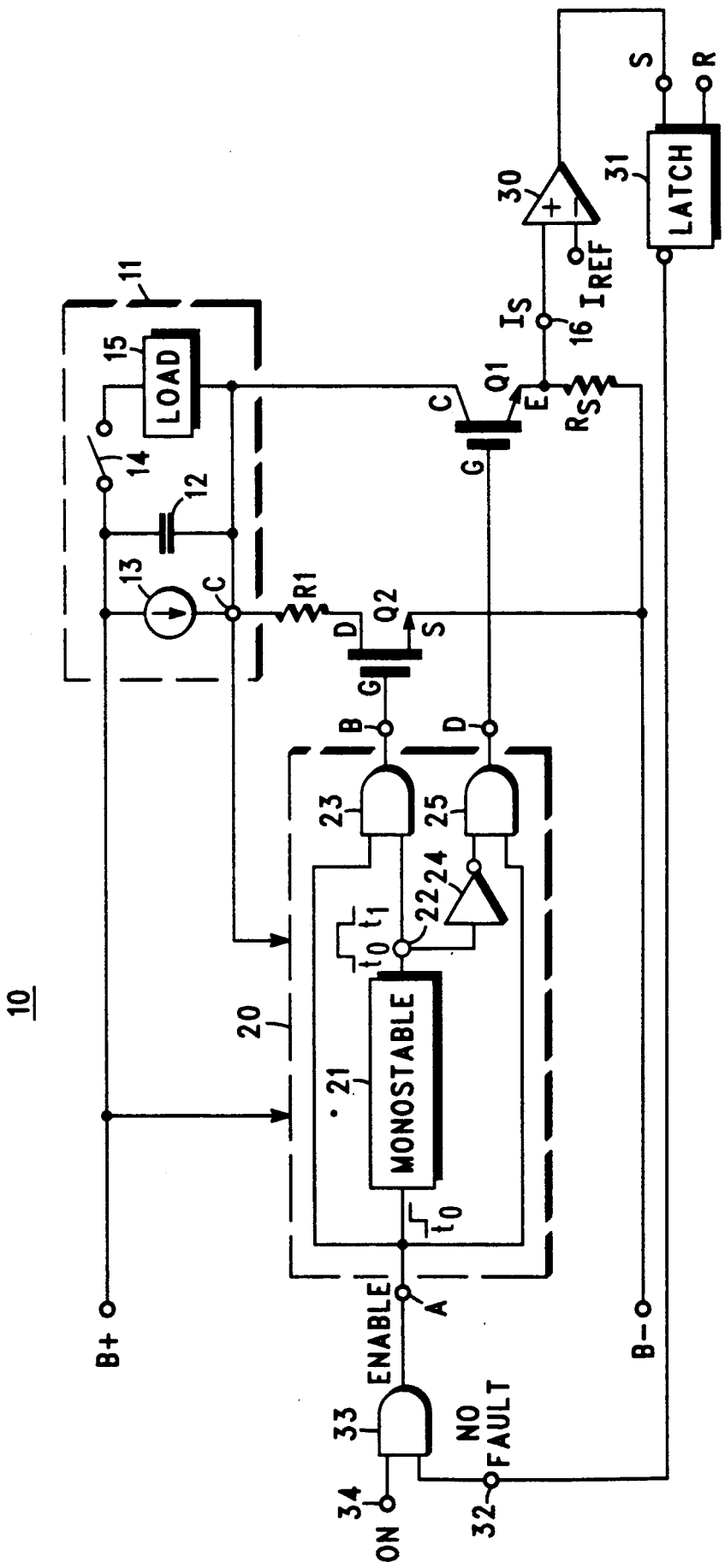
FIG. 1 is an electrical schematic of one embodiment of the present invention.

Referring now to FIG. 1, the circuitry for a DC power switch 10 is illustrated which is used to supply DC power to an effective capacitive load 11 shown dashed in FIG. 1. The load 11 is shown as comprising a large effective capacitor 12, of the order of 300 microfarads, connected in parallel with an effective 100 microamp constant current source 13. The parallel connection of the capacitor 12 and constant current source 13 is connected, via a selective on/off switch 14, to an effective resistive type equivalent load 15. The components 12 through 15 represent the circuit equivalents of the capacitive load 11. Preferably the load 11 corresponds to a load such as a switching DC power supply that can supply substantial power to a computer or such component. It is contemplated that after the effective capacitor 12 is charged up, and the switch 14 is closed, the load 11 will typically draw up to a maximum of 30 amps of current. Thus any series switch for the load 11 should have at least a 30 amp maximum current capability. In addition, it is desired to shorten, as much as possible, the time that it takes to initially charge up the capacitor 12, and this should occur without requiring extremely complex or costly circuitry for implementing the function of a series semiconductor switch. This is achieved by the circuit 10.

In FIG. 1, positive and negative DC power bus terminals B+ and B− are provided. In the preferred embodiment, the voltage between the terminals B+ and B− can vary anywhere from a minimum of 280 volts to a maximum of 430 volts DC. A main semiconductor switch device Q1, preferably comprising an IGBT (insulated gate bipolar transistor) or a power FET transistor, is connected in series with the capacitive load 11 between the positive and negative DC bus terminals B+ and B−. The transistor Q1 has a pair of main output electrodes, corresponding to collector and emitter electrodes, with the impedance between these electrodes being determined in accordance with a control signal received at the gate, or main, control electrode of the transistor Q1. A small value current sensing resistor $R_s$ is connected between the emitter terminal of transistor Q1 and the negative DC bus terminal B− and provides a current sensing voltage $I_s$ at a terminal 16 corresponding to the source electrode. The collector electrode of the transistor Q1 is connected to a terminal C and the load 11 is directly connected between this terminal and the positive DC bus terminal B+. The gate electrode of Q1 corresponds to a terminal D.

The configuration described above comprises a single transistor used as a DC power switch or circuit breaker for the load 11. However, this configuration, by itself, is not satisfactory in that during the initial charging current for the capacitor 12 very high power dissipation for Q1 will exist which could readily result in damage to the transistor Q1. For example, assuming that the capacitor 12 initially had no charge thereacross due to the constant current source 13, an initial charging current of only 0.2 amps through the transistor Q1 would result in substantial power dissipation for Q1 because of the hundreds of volts of DC potential which would be applied across the drain and source terminals of this transistor. Of course, as the capacitor 12 does get charged up the power dissipation requirements on the transistor Q1 would be less. For normal steady state conditions, which correspond to a load current of approximately 30 amps, only a one volt drop would appear across the collector and emitter electrodes of the transistor Q1 thus requiring a power dissipation rating of 30 watts for this transistor. This is contrasted with the 60 or more watt rating for the transistor which would be required during the initial charging of the capacitor 12. To overcome this problem without using a costly transistor Q1 having a very high power rating, the DC power switch 10 of the present invention essentially provides an alternative initial charging path that is able to more readily withstand initial power dissipation transients.

In FIG. 1, the DC power switch 10 includes a secondary FET (field effect transistor) switching transistor Q2 which has its source output electrode connected to the terminal B− and its drain output electrode connected through a resistor $R_1$ to the terminal C. The gate control electrode of the transistor Q2 is connected to a terminal B. The impedance between the drain and source electrodes of transistor Q2 is determined in accordance with a control signal received at the terminal B. The resistor $R_1$ is connected in series with the impedance provided between the drain and source terminals of Q2, and this series connection is connected to the collector and emitter electrodes of transistor Q1 and connected in parallel with the impedance provided between these electrodes.

In FIG. 1, the DC power switch 10 includes a control circuit 20 (shown dashed) which is connected to both the main transistor Q1 and the secondary transistor Q2 and controls these transistors by providing the control signals at the terminals B and D. The control circuit 20 has an enable input terminal A at which it receives an enable signal. In response to the enable signal, the circuit 20 essentially fully turns on the secondary transistor Q2 and then subsequently turns this transistor off and turns on the main transistor Q1. This results in the transistor Q2 providing the initial charging current for the capacitor 12. However, the transistor Q2 does not have to have a substantial power dissipation rating because the voltage between the terminals C and B− is now not just applied across the output electrodes of a single transistor but is applied across the transistor Q2 and the resistor $R_1$. The resistor $R_1$ can be a power resistor, but this is still relatively inexpensive with regard to either the transistor Q2 or the transistor Q1 having a very high power dissipation rating.

While the resistor $R_1$ does results in a RC time constant for charging up the capacitor 12, this circuit configuration still permits the relatively rapid charging up of the capacitor 12 as compared to how fast this capacitor would be charged if the current for the transistor Q1 was limited during the initial charging transient such that the power dissipation for Q1 would never exceed the required nominal steady state 30 watt power dissipation rating. In other words, if you select a transistor Q1 such that its power rating is just sufficient for providing the steady state current required by the load 11, then a power rating of 30 watts, for example, would be required for this transistor. If Q2 and $R_1$ were not present and you used feedback circuitry to make sure that this Q1 power dissipation rating was never exceeded even during an initial charging transient, then the transistor Q1, during the charging transient, would only be able to provide a 0.1 amp charging current because the voltage across the collector and emitter terminals of the transistor would be approximately 300 volts or more. Because the present invention provides the secondary charging path of the transistor Q2 and the resistor $R_1$, a much larger charging current can be provided during the initial charging transient. This occurs even though the transistor Q2 can have a very small power dissipation rating because most of the power in the secondary charging path will be dissipated by the resistor $R_1$. This is because a substantial portion of the voltage drop between the terminals C and B− will occur across the resistor $R_1$. For example, for a value of $R_1$ equal to approximately 200 ohms, the secondary charging path of Q2 and $R_1$ can provide 1.5 amps of charging current for the capacitor 12, while a power dissipation of only 1.5 watts would be required of the transistor Q2 (1.5 amps times the one volt drain to source potential for the transistor Q2).

Thus clearly the present invention allows the faster charging up of the capacitor 12 than would be possible by limiting the charging current of a single transistor, such as the transistor Q1, such that this transistor never exceeded the rating that was required of it due to the steady state current needs of the load 11. Also, this has been achieved without utilizing a single semiconductor switch having an enormous power rating such that it can withstand the initial charging current power dissipation transient and also the subsequent steady state power dissipation requirement.

The remaining description illustrates how the control circuit 20 implements the above stated features of the present invention in conjunction with other circuitry in the DC power switch 10, and how an alternate circuit 50 shown in FIG. 3 can be utilized to obtain equivalent performance.

In FIG. 1, the control circuit 20 includes a monostable multivibrator (one shot) circuit 21 which receives as an input the signal at the enable terminal A and provides an output pulse in response thereto at a terminal 22. The terminal 22 is connected as an input to AND gate 23 which has another input directly connected to the enable terminal A. The terminal 22 is coupled through an inverter 24 as an input to an AND gate 25 which receives an additional input by virtue of a direct connection to the enable terminal A. The output of the AND gate 23 is directly connected to the terminal B, and the output of the AND gate 25 is directly connected to the terminal D. Referring now to FIGS. 2A through 2E, the basic operation of the DC power switch 10 will now be discussed in conjunction with the circuit shown in FIG. 1.

The signal waveforms shown in FIGS. 2A through 2D correspond to the waveforms of the signals provided at the terminals A through D shown in FIG. 1, respectively. Thus FIG. 2A illustrates an enable signal 26 corresponding to the enable signal provided at the terminal A. At a time $t_0$, the enable signal 26 is provided with a high logic state and this is maintained from the time $t_0$ onward. This is indicative of the desired operation of the DC power switch wherein from time $t_0$ on DC power is to be provided to the load 11, except in the case of a detected fault. In response to the rising transition 26A of the enable signal 26, the monostable 21 provides a pulse for a predetermined time duration between the time $t_0$ and a subsequent time $t_1$. During this time duration, the AND gate 23 will provide a signal 27 at the terminal B that directly corresponds to this pulse. This results in fully turning on transistor Q2 for the time period $t_0$ through $t_1$. Subsequently, when the pulse from the monostable 21 expires at $t_1$, the signal 27 at the terminal B will resume a low logic state resulting in turning off the transistor Q2. A signal 28 shown in FIG. 2D illustrates that between the time $t_0$ and $t_1$, the transistor Q1 will remain in an off state. At the time $t_1$, the transistor Q1 will be turned on and remain on, absent the detection of any kind of fault.

FIG. 2C illustrates a signal 29 representative of the charging up of the capacitor 12 wherein this signal corresponds to the voltage at the terminal of capacitor 12 corresponding to the terminal C. Prior to the time $t_0$ this voltage is at B+ potential due to the constant current source 13. During the time from $t_0$ through $t_1$, the voltage at the terminal C will decrease towards the potential B− in accordance with the RC time constant determined by the resistor $R_1$ and the capacitor 12. At the time $t_1$, the transistor Q1 will turn on resulting in a much more rapid achieving of the B− potential at the terminal C. Thus the signal 29 in FIG. 2C is representative of the charging up of the capacitor 12 by the turning on of the secondary charging path and then the subsequent turning on of the main transistor Q1. The signal 29 at terminal C is also representative of the voltage applied across the transistor Q1 and resistor $R_s$ and the transistor Q2 and resistor $R_1$ with respect to B−.

It is significant to note that when transistor Q1 is turned on at $t_1$, only a relatively small potential will be provided across its collector and emitter terminals because the capacitor 12 has been almost fully charged by this time. Thus no excessive substantial power dissipation for Q1 will exist during the final charging up the capacitor 12 despite the fact that now a larger current will now be provided by the transistor Q1 due to the absence of the resistor R1 from its charging path.

FIG. 1 also illustrates fault detection circuitry to essentially turn off the transistors Q1 and Q2 in case excessive current is detected when the transistor Q1 is turned on. This excessive current would not correspond to just the expected current produced during the final charging of the capacitor 12, but would be indicative of a fault such as the short circuiting of the load 15 when the switch 14 was closed. This fault detection circuitry essentially comprises a comparator 30 which receives at its positive input the current sense signal $I_s$ at the terminal 16. A negative input of the comparator 30 is connected to a maximum current reference potential $I_{REF}$. The output of the comparator 30 is provided to a set terminal S of a latch 31 which provides a latched output, if a fault is detected, to a terminal 32. A reset terminal R of the latch 31 is shown and is to be connected such that the latch 31 is reset as desired. With this configuration, a high logic state at the terminal 32 is indicative of a no fault condition and a latched low logic state at this terminal indicates the detection and presence of a fault. The terminal 32 is provided as an input to AND gate 33 which receives an additional input from a terminal 34 designated as a ON terminal. The output of the AND gate 33 is directly coupled to the enable terminal A so that the AND gate 33 provides the enable signal 26 at this terminal.

Essentially, when it is desired to turn on the DC power switch 10, a high logic signal is provided at the terminal 34. Since the transistor Q1 is not yet turned on, the comparator 30 provides a low output which results in a high or no fault signal being provided by latch 31 at the terminal 32. This results in a high logic state for the enable signal 26 at the terminal A. If during operation of the circuit 10 the transistor Q1 is turned on and draws excessive current, this fault is detected and results in setting latch 31 and providing a low logic signal at the terminal 32. This results in terminating the enable signal 26 at the terminal A which in turn, via the AND gates 23 and 25, results in turning off any of the transistors Q1 and Q2 which may be on. This therefore disconnects the load 11 from the DC power buses in case of a detected fault. This type of operation is not illustrated in FIGS. 2A–2D.

It should be noted while the circuitry in FIG. 1 and the waveforms in FIGS. 2A through 2D illustrate that during the initial charging of capacitor 12 the transistor Q2 is turned off at the same time ($t_1$) that the transistor Q1 is turned on, this does not necessarily have to be the case. The transistor Q2 could be left on for some time after the time $t_1$. This is because the turning on of the transistor Q1 will essentially short circuit the secondary charging path such that it doesn't matter if the transistor Q2 is still on. However, when it is desired to interrupt the DC power provided to the load 11 because of the detection of a fault, both of the transistors Q1 and Q2 should be turned off. Thus the transistor Q2 should be turned off no later than the turning off of the transistor Q1.

Referring now to FIG. 3, an alternative embodiment for the control circuit 20 is shown wherein this alternative control circuit is designated by the reference numeral 50. The terminals A through D shown in FIG. 3 directly correspond to the same designated terminals shown in FIG. 1. In FIG. 3, the enable signal at the terminal A is connected as an input to an AND gate 51 and an AND gate 52, and the outputs of these AND gates are directly connected to the D and B terminals, respectively. The terminal C is connected to the negative input of a comparator 53 which has its negative input directly connected to a referenCe terminal $V_{REF}$ at which a fixed reference voltage $V_{REF}$ is provided. The voltage $V_{REF}$ is shown in FIG. 2C with respect to the signal 29 at terminal C. The output Of the comparator 53 is provided at a terminal 54. Preferably the voltages at the terminals $V_{REF}$ and C are scaled down by voltage dividers so that only corresponding representative lower magnitude voltages are provided as inputs to the comparator 53. The terminal 54 is provided as an input to an inverter 55 which provides an input to the AND gate 52. The terminal 54 also is directly connected as an input to the AND gate 51.

The control circuit 50 shown in FIG. 3 implements the same sequential turning on of the transistors Q2 and Q1 to provide for the initial charging up of the capacitor 12 and the subsequent providing of steady state current by the transistor Q1. However, now instead of the utilization of a monostable circuit, the predetermined time $t_1$ at which the transistor Q2 is turned off and the transistor Q1 is turned on is now a function of the voltage provided at the terminal C. In other words, the embodiment in FIG. 3 will implement turning transistor Q2 off and turning transistor Q1 on when the voltage across Q1 and $R_s$ is equal to the reference voltage $V_{REF}$. This configuration will therefore result in turning on Q1 and turning off Q2 when the charging of the capacitor 12 is substantially completed and the voltage across Q1 and $R_s$ is low enough that excessive power dissipation and current in Q1 should not occur when Q1 is turned on. In some situations the embodiment shown in FIG. 3 may be preferable and lead to more accurate control of the time at which the transistor Q1 should be turned on such that Q1 will only have to endure a minimum power dissipation due to the transient charging current it provides for the capacitor 12.

While we have shown and described specific embodiments of the present invention, other improvements and modifications will occur to those skilled in the art. All such modifications and improvements which retain the basic underlying principles disclosed and claimed herein are within the scope of this invention.

What is claimed:

1. A DC power switch for a capacitive load comprising:
   a main semiconductor switch device to be connected in series with a capacitive load between positive and negative DC bus terminals, said main switch device having a main control electrode and a pair of main output electrodes the impedance therebetween being determined in accordance with a control signal received at said main control electrode;
   a secondary semiconductor switch device having a secondary control electrode and a pair of secondary output electrodes the impedance therebetween being determined in accordance with a control signal provided at said secondary control electrode;
   a resistor connected in series with the impedance provided between said secondary output electrodes, said series connection connected to the main output electrodes and connected in parallel to the impedance between said main output electrodes; and
   control circuit means connected to said main and secondary semiconductor switch devices for control thereof by providing said control signals at said control electrodes thereof, said control circuit means receiving at an input terminal an enable signal and, in response thereto, initially turning on said secondary switch device and subsequently turning on said main switch device.

2. A DC power switch according to claim 1 wherein said control circuit means includes means for preventing said main switch device from being on during the absence of said enable signal.

3. A DC power switch according to claim 2 wherein said control circuit means includes means for preventing said secondary switch from being on during the absence of said enable signal.

4. A DC power switch according to claim 1 wherein said control circuit means includes means for turning said secondary switch device off no later than turning said main switch device off.

5. A DC power switch according to claim 1 wherein said control circuit means including means for turning said secondary switch device off and having said main switch device on after the turning off of said secondary switch device.

6. A DC power switch according to claim 1 wherein said control circuit means includes a monostable circuit which, in response to a transition of said enable signal, establishes a predetermined initial time period during which said secondary switch device is on.

7. A DC power switch according to claim 6 wherein said control circuit means includes circuitry for turning said main switch device on after said predetermined initial time period.

8. A DC power switch according to claim 1 which includes fault detection circuitry for detecting the existence of a fault and producing a fault signal indicative thereof, and which includes circuitry for, in response to said fault signal, turning off any of said main and secondary switch devices which may happen to be on by altering the control signals received thereby.

9. A DC power switch according to claim 8 which includes circuitry for terminating said enable signal in response to said fault signal and wherein said control circuit means has two AND type gates each providing one of said main and secondary control signals, respectively, as an output thereof and wherein said enable signal is provided as an input to each of said AND type gates.

10. A DC power switch according to claim 9 wherein said control circuit means includes a monostable circuit which, in response to a transition of said enable signal, provides a pulse having a predetermined duration, said pulse being coupled as an input to each of said AND type gates.

11. A DC power switch according to claim 1 wherein said control circuit means includes circuitry for turning said main switch device on in response to the voltage at one of said main device output electrodes equalling a predetermined level.

12. A DC power switch for a capacitive load comprising:
   a main semiconductor switch device to be connected in series with a capacitive load between positive and negative DC bus terminals, said main switch device having a main control electrode and a pair of main output electrodes the impedance therebetween being determined in accordance with a control signal received at said main control electrode;
   a secondary semiconductor switch device having a secondary control electrode and a pair of secondary output electrodes the impedance therebetween being determined in accordance with a control signal provided at said secondary control electrode;

a resistor connected in series with the impedance provided between said secondary output electrodes, said series connection connected to the main output electrodes and connected in parallel to the impedance between said main output electrodes;

control circuit means connected to said main and secondary semiconductor switch devices for control thereof by providing said control signals at said control electrodes thereof, said control circuit means receiving at an input terminal an enable signal and, in response thereto, initially turning on said secondary switch device and subsequently turning on said main switch device, fault detection circuitry for detecting the existence of a fault and producing a fault signal indicative thereof, and circuitry for, in response to said fault signal, turning off any of said main and secondary switch devices which may happen to be on by altering the control signals received thereby, wherein said main and secondary semiconductor switch devices comprise transistors.

13. A DC power switch according to claim 12 wherein said control circuit means including means for turning said secondary switch device off and having said main switch device on after the turning off of said secondary switch device.

14. A DC power switch according to claim 13 wherein said control circuit means includes means for preventing said main switch device from being on during the absence of said enable signal.

15. A DC power switch according to claim 14 wherein said control circuit means includes means for preventing said secondary switch from being on during the absence of said enable signal.

16. A DC power switch according to claim 15 which includes circuitry for terminating said enable signal in response to said fault signal.

17. A DC power switch according to claim 16 wherein said control circuit means includes a monostable circuit which, in response to a transition of said enable signal, establishes a predetermined initial time period during which said secondary switch device is on.

18. A DC power switch according to claim 16 wherein said control circuit means includes circuitry for turning said main switch device on in response to the voltage at one of said main device output electrodes equalling a predetermined level.

* * * * *

UNITED STATES PATENT AND TRADEMARK OFFICE
CERTIFICATE OF CORRECTION

PATENT NO. : 5,030,844
DATED : July 9, 1991
INVENTOR(S) : Edward Li and John E. Hermann It is certified that error appears in the above-identified patent and that said Letters Patent is hereby corrected as shown below:

On the title page, Item [54], and in Column 1, lines 2 and 3: Delete;

"WITH INRUSH PREVENTION" and insert -- WITH TURN ON CONTROL

CIRCUITRY--

Signed and Sealed this

Nineteenth Day of April, 1994

Attest:

BRUCE LEHMAN

Attesting Officer  Commissioner of Patents and Trademarks